United States Patent
Scherer et al.

(10) Patent No.: US 10,418,231 B2
(45) Date of Patent: Sep. 17, 2019

(54) METHOD FOR PRODUCING A MULTILAYER COATING AND DEVICE FOR CARRYING OUT SAID METHOD

(71) Applicant: Leybold Optics GmbH, Alzenau (DE)

(72) Inventors: Michael Scherer, Kahl (DE); Jurgen Pistner, Alzenau-Michelbach (DE); Walter Lehnert, Gelnhausen (DE); Harro Hagedorn, Frankfurt (DE); Gerd Deppisch, Aschaffenburg (DE); Mario Roder, Gelnhausen (DE)

(73) Assignee: Leybold Optics GmbH, Alzenau (DE)

( * ) Notice: Subject to any disclaimer, the term of this patent is extended or adjusted under 35 U.S.C. 154(b) by 0 days.

(21) Appl. No.: 14/622,597

(22) Filed: Feb. 13, 2015

(65) Prior Publication Data

US 2015/0162173 A1     Jun. 11, 2015

Related U.S. Application Data

(62) Division of application No. 10/537,224, filed as application No. PCT/EP03/13649 on Dec. 3, 2003, now Pat. No. 8,956,511.

(30) Foreign Application Priority Data

Dec. 4, 2002   (DE) .................................... 10256877
Oct. 13, 2003  (DE) .................................... 10347521

(51) Int. Cl.
   *H01J 37/34*    (2006.01)
   *C23C 14/00*    (2006.01)
   (Continued)

(52) U.S. Cl.
   CPC ...... *H01J 37/3473* (2013.01); *C23C 14/0078* (2013.01); *C23C 14/0094* (2013.01);
   (Continued)

(58) Field of Classification Search
   CPC ... C23C 14/0078; C23C 14/024; C23C 14/08; C23C 14/547; C23C 14/0094;
   (Continued)

(56) References Cited

U.S. PATENT DOCUMENTS 4,420,385 A      12/1983  Hartsough
4,851,095 A  *   7/1989   Scobey ..................... C23C 8/02
                                                    204/192.12

(Continued)

FOREIGN PATENT DOCUMENTS

EP         0306069 A2      3/1989
EP         0600303 A2      6/1994
   (Continued)

*Primary Examiner* — Michael A Band
(74) *Attorney, Agent, or Firm* — Mintz Levin Cohn Ferris Glovsky and Popeo, P.C.; John A. Bauer, Esq.; Michael A. Mattoni

(57) ABSTRACT

A method for reducing the optical loss of the multilayer coating below a predetermined value in a zone by producing coating on a displaceable substrate in a vacuum chamber with the aid of a residual gas using a sputtering device. Reactive depositing a coating on the substrate by adding a reactive component with a predetermined stoichiometric deficit in a zone of the sputtering device. Displacing the substrate with the deposited coating into the vicinity of a plasma source, which is located in the vacuum chamber at a predetermined distance from the sputtering device. The plasma action of the plasma source modifying the structure and/or stoichiometry of the coating, preferably by adding a predetermined quantity of the reactive component to reduce the optical loss of the coating.

16 Claims, 14 Drawing Sheets

(51) Int. Cl.
  *C23C 14/02* (2006.01)
  *C23C 14/08* (2006.01)
  *C23C 14/54* (2006.01)

(52) U.S. Cl.
  CPC ............ *C23C 14/024* (2013.01); *C23C 14/08* (2013.01); *C23C 14/547* (2013.01); *H01J 37/34* (2013.01); *H01J 37/3405* (2013.01); *H01J 37/3476* (2013.01); *H01J 2237/3321* (2013.01)

(58) Field of Classification Search
  CPC ............ C23C 14/0068; C23C 14/0073; H02J 37/3476; H02J 37/3473; H02J 37/34; H02J 2237/3321; H02J 37/3411; H02J 37/3488; H02J 37/3405
  See application file for complete search history.

(56) References Cited

U.S. PATENT DOCUMENTS

| | | | |
|---|---|---|---|
| 4,931,169 A * | 6/1990 | Scherer | C23C 14/0042 204/192.12 |
| 5,525,199 A | 6/1996 | Scobey | |
| 5,618,388 A | 4/1997 | Seeser et al. | |
| 5,672,252 A | 9/1997 | Hayashi et al. | |
| 5,820,946 A | 10/1998 | Lee et al. | |
| 5,849,162 A | 12/1998 | Bartolomei | |
| 5,879,519 A * | 3/1999 | Seeser | C23C 8/02 118/719 |
| 6,127,048 A | 10/2000 | Beele | |
| 6,217,720 B1 * | 4/2001 | Sullivan | C23C 14/548 204/192.13 |
| 6,274,014 B1 | 8/2001 | Matsumoto et al. | |
| 6,287,430 B1 | 9/2001 | Matsumoto et al. | |
| 6,346,176 B1 | 2/2002 | Hughes | |
| 6,440,280 B1 | 8/2002 | Pratt et al. | |
| 6,613,393 B1 * | 9/2003 | Rauschnabel | B05D 1/62 204/192.12 |
| 6,743,341 B2 * | 6/2004 | Szczyrbowski | C23C 14/0042 118/692 |
| 8,956,511 B2 | 2/2015 | Scherer et al. | |

FOREIGN PATENT DOCUMENTS

| | | |
|---|---|---|
| EP | 0 719 874 A | 7/1996 |
| JP | 01-122905 | 5/1989 |
| JP | 06-172990 | 6/1994 |
| JP | 2001-234338 A | 8/2001 |
| JP | 2002-212719 A | 7/2002 |

* cited by examiner

METHOD FOR PRODUCING A MULTILAYER COATING AND DEVICE FOR CARRYING OUT SAID METHOD

CROSS-REFERENCES TO RELATED APPLICATIONS

This application is a divisional of U.S. patent application Ser. No. 10/537,224, filed on Nov. 16, 2005 (now U.S. Pat. No. 8,956,511, issued on Feb. 17, 2015), which is a 35 U.S.C. § 371 national stage entry of PCT/EP2003/013649 filed on Dec. 3, 2003, which claims priority to German Patent Application No. DE 102 56 877.4 filed on Dec. 4, 2002 and German Patent Application No. DE 103 47 521.4 filed on Oct. 13, 2003. The contents of each of the above applications are hereby incorporated herein in their entireties by reference.

BACKGROUND OF THE INVENTION

The invention relates to a method for producing thin coatings and to an apparatus for the practice of the method.

Many different methods are known in the field of physical and chemical depositing technologies for the production of thin coatings. Different methods are used according to the desired properties of the coating to be deposited and on the material systems chosen.

The method of cathode sputtering is advantageous, especially for materials of high melting point, in which a plasma is ignited in a vacuum in a range that is clearly above any typical residual gas pressure for vapor depositing processes, by using an electrical field from which ions are accelerated against a target that is at a high electrical cathode potential, and these ions knock atoms out of the target which then deposit themselves on the walls of the vacuum chamber and on a substrate usually at ground potential or at a low bias voltage, which is situated at a distance from the target. Heating of the material source is not necessary, and instead the target is cooled during the process. The result is a residual gas pressure usually mostly of an inert gas such as, say, argon which has no unwanted influence on the coating that forms on the substrate. For the deposition of compounds such as nitrides, carbides or oxides or the like, appropriate reactive gases can be admixed additionally to the sputtering gas.

The substrate is usually arranged outside of the plasma zone in order to prevent any damage to the freshly growing coating by radiation from the plasma or by residual sputtering effects. The average free length of travel of the ions must be great enough so that they can reach the target with sufficient kinetic energy, i.e., with minimum interference due to further collision processes in the residual gas, which sets a maximum limit on the possible residual gas pressure. On the other hand, the pressure must be high enough to be able to ignite a stable plasma. With magnetic field-supported cathode sputtering it is possible to produce an elevated electron density on the target, resulting in a high plasma density at the target and therefore a greatly elevated sputtering rate.

By the addition of reactive components, especially oxygen, to the inert gas, oxides can also be produced. Such a reactive sputtering process is disclosed, for example, in WO 01/73151 A1, where the oxygen partial pressure during the sputtering of the oxide must be controlled by means of a lambda probe, so that a stoichiometric oxide can form in the growing coating. Of course, the target also reacts with the reactive gas, so that competing processes, namely ablation on the one hand, and the formation of oxide on the target surface to inhibit the ablation. This in turn has repercussions on the electrical potential in the coating chamber, the formation of plasma, and the like. Likewise, the coatings of the sputtered material also form, getter surfaces which bind oxygen, for example, as a reactive component and thus lead to a mutual, hard to predict interdependence of a variety of process parameters. Here too the relationship among the coating parameters is very complex. Often there is then a mutual influence when just one coating parameter is varied. Depending on the coating material to be deposited, it is therefore necessary to attune the coating processes and the coating parameters to one another. This is all the more true the more complex a layer system to be deposited is, say, in the case of the deposition of multiple layers having special functional properties, especially optical flinction coatings. The problems mentioned are especially pronounced in the so-called reactive DC magnetron sputtering of metallic compounds, in which the requirement of a reacting compound on the substrate surface in the case of a metallic target surface can be achieved only with great expense. For the production of insulating coatings, such as, e.g., $SiO_2$, $Al_2O_3$ and the like, methods have therefore already been developed in which, by means of two pairs of magnetron sputtering cathodes supplied by an alternating current source, two targets are used in alternation. The polarities of the target potentials usually vary in the kHz range, i.e., each cathode is alternately cathode and anode. This leads to a definite charge transport between cathode and anode without the hampering effect of an oxide coating on the target surfaces, in contrast to the disturbing effect of the so-called "disappearing anode" in the case of reactive DC magnetron sputtering.

Efficient operation, however, requires operating in the so-called transition area since otherwise the formation of oxide on the target surface is faster than the ablation rate.

EP 0 795 623 A1 discloses an apparatus for the application of thin titanium oxide coatings by reactive cathode sputtering. Accordingly the power supply to the cathode is regulated by the signal from a ÿ probe sensor which compares the content of oxygen in the vacuum chamber with a reference gas. The method is especially suited to the long stable deposition of oxides, which are to be made as uniform as possible, with an unvarying composition.

DE 42 36 264 C1 discloses a plasma-supported electron beam vapor deposition in which an oxide is vaporized at a very high rate by an electron beam vaporizer and deposited on a substrate. During the vaporization, however, the oxide dissociates so that the oxygen is lost and is no longer available for oxidation in the growing coating. Between substrate and vaporization source there is therefore a plasma space containing an oxygen plasma, in which the vapor is excited on the way to the substrate, so that a stoichiometric oxide can deposit itself on the substrate. Depending on the material system, the deposition of a stoichiometric oxide is successful since either the partial pressure of the reactive gas or the plasma parameters are regulated during the coating process.

The relationships are very complex and can hardly be transferred from one material system to another. Variation of individual process parameters produces different results in different material systems. Deposition parameters optimized for aluminum oxide, for example, do not yield optimum results, in the case of silicon oxide, for example. Moreover, different vaporization parameters which can not be ascertained separately appear also within one and the same material system, which lead to undesired alterations of the properties of the deposited coatings and make the repeatability of a started coating process additionally difficult.

In EP 0 1516 436 E1 a magnetron sputtering apparatus is disclosed for the reactive depositing of a material onto a substrate with a magnetron sputtering apparatus and a secondary plasma apparatus. The sputtering system and the secondary plasma apparatus have each sputtering and activation zones which are atmospherically and physically adjacent. By bringing together the sputtering and activation zones, the plasmas of both zones are mixed to form a single, continuous plasma.

In EP 0 716 180 B1 a coating apparatus is disclosed, with a deposition system and an apparatus for producing a plasma. The deposition and plasma apparatus can be operated selectively, so that a composition layer is formed which has at least several layers. The composition of each layer can be chosen from at least one of the following substrates: a first metal, a second metal, an oxide of the first metal, an oxide of the second metal, mixtures of the first and second metal and oxides of mixtures of the first and second metal.

SUMMARY OF THE INVENTION

The problem of the invention is to provide a method for the production of thin coatings, by which the composition of the coating can be controlled and influenced, and create an apparatus for the practice of the method.

It is furthermore the problem of the invention to create a method and an apparatus for producing an optically low-loss multilayer coating, especially by the above-described method of the invention.

The problem is solved by the features of the independent claims.

In contrast to the oxidation of metal coatings or semiconductor coatings, the targeted deposition of a hypostoichiometric coating in the vicinity of a sputtering apparatus permits an increase of the coating rate, since the subsequent plasma treatment can oxidize thicker coatings to the stoichiometric oxide in less time. Furthermore, the reactive deposition according to the invention permits the reactive deposition of a coating according to the invention with a predetermined thickness with an optical loss lower than a given minimum, and subsequent plasma treatment permits a relative fast preparation of coatings with low optical losses. In comparison to known reactive sputtering processes, the sputtering process is less ended by troubles such as flashovers or cathode arcing, while at the same time coatings of high quality are formed.

According to a further aspect of the invention, in the case of a process for producing a multilayer coating with at least one reactively operated coating apparatus and at least one reaction apparatus in a vacuum chamber on at least one substrate moving relative to the said apparatus, the deposit of a second coating with at least one reactive component is performed. By means of the reaction apparatus a change of the structure and/or the stoichiometry of the coatings takes place. To lessen any optical loss of the multilayer coating below a given value, provision is made according to the invention to construct an interface in an area of the second layer adjoining the first layer by means of the coating apparatus, having a thickness $d_1$ and a value of a deficit of the reactive component DEF that is less than a value $DEF_1$. This method permits a comprehensive control of the changing of the structure and/or stoichiometry of the coatings and to produce preferably multilayer coatings with low optical losses and a low optical reflection and high transmissions.

The method of the invention for the production of multilayers with minimal optical losses sets out from the knowledge that the deposited coatings should have insofar as possible a complete stoichiometry between a first constituent and a reactive constituent. According to the invention the reactive sputtering process is conducted in a mode of controlled substoichiometry and in a second step the lacking content of the reactive constituent is made available by the action of the additional plasma source. For example, the sequence for producing stoichiometric $SiO_2$ coatings is as follows: in a first step a sputter coating is performed using a metallic silicon target, a reactive gas flow of oxygen being used and leading to a substoichiometric compound of a coating of, for example, $SO_{1.6}$. The corresponding value of the deficit of the reactive component DE is then 0.4. In a second step, a plasma activation is performed with oxygen as reactive gas, which leads to a fully stoichiometric $SiO_2$ coating.

The deposit of such coatings is determined by parameters which are material-related. In this case it is always possible, according to the invention, to assure an optimum compromise between a high sputtering rate and a maximum achievable stoichiometry in a first step, combined with a maximum effective following treatment by the plasma source in the second step.

According to the invention, in the production of coatings, especially multilayer coatings with a high-refraction layer and an adjoining low-refraction layer, in order to avoid optical losses. These measures are preferentially indicated, since due to the extremely high reactivity of silicon, a substoichiometric compounds, such as $SiO_{1.6}$ for example, which is sputtered onto a fully stoichiometric $Nb_2O_5$ layer, oxygen is removed from the $Nb_2O_5$ coating before the $SiO_{1.6}$ layer has been changed by the plasma source to a fully stoichiometric state. This leads to an impairment of the optical properties of at least some layers of the high-refraction material and thus to a degradation of the multilayer coating, especially in proportion to the number of interfaces involved. To prevent the described effect, in for example an area of the interface directly adjacent the high-refraction material, a low-refraction layer of a certain thickness is provided according to the invention, which is in a largely or completely stoichiometric state. For example, this layer can typically have a thickness of 3.6 nm in the case of $SiO_2$. This area of the interface acts as a barrier for the protection of the high-refraction layer underneath it. As soon as a critical thickness of the said area has been reached the parameters of the sputtering process can be changed in the direction of the deposit of coatings of a high degree of substoichiometry or a higher value of the deficit DEF of the reactive component. Accordingly, an $SiO_2$ coating made by the method of the invention has an internal structure, wherein a first part has a slight oxygen deficit and a second part a higher level of the deficit.

Preferentially, the production of multilayer coatings with layers of high-refraction and low-refraction material alternating one on the other. Preferentially, $Nb_2O_5$, $Ta_2O_5$, $ZrO_2$ or $Al_2O_3$ and, as low-refraction material, $SiO_3$, are provided.

With the method of the invention, thin coatings are successfully deposited with high precision and excellent quality. In an especially preferred embodiment the creation of oxide, carbide and nitride coatings of high optical quality is successfully accomplished.

Additional configurations and advantages of the invention are to be found in the further claims and, independently of their summation in the claims, in the description.

BRIEF DESCRIPTION OF THE DRAWINGS

The invention is further described with the aid of drawings, wherein the figures show schematically.

DETAILED DESCRIPTION OF THE EMBODIMENTS

With the method of the invention, coatings with low optical losses can be made by reactive sputtering without breaking the vacuum, which contain reaction components such as oxygen, carbon or nitrogen. A production of oxides is described hereinafter; the method is, however, also suitable for carbides or nitrides or mixtures such as oxynitrides or carbonitrides or the like, while also 2 or more reactive gases can be used simultaneously as reactive components.

Figure 1:
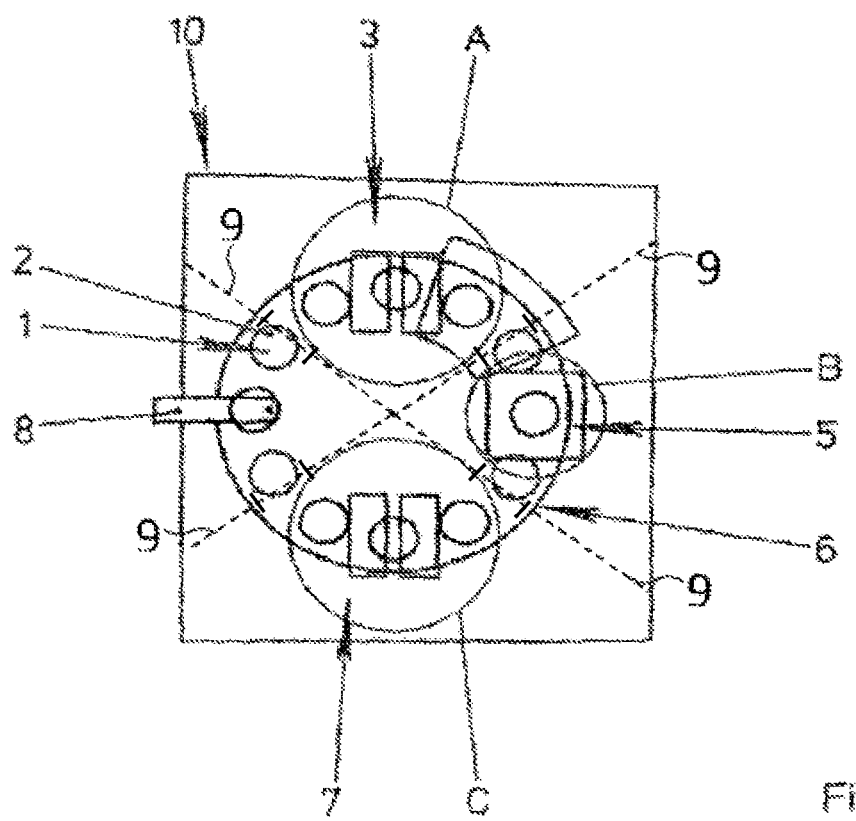
FIG. 1 A representation of a preferred arrangement of substrate, target and plasma source for the oxidation of a coating.

FIG. 1 shows a schematic drawing of a preferred system for depositing a coating according to one embodiment of the invention. An oxide coating is deposited with a residual gas on a substrate 2 in a vacuum chamber 10. The vacuum chamber 10 is divided into several areas, A, B and C. Preferably each area A, B and C has its own gas delivery, not shown, as well as its own pump supply. Also, more than three such areas can be provided. Areas A, B and C are preferably divided off from one another by diaphragms 9 which are connected to one another only through slits. Thus, a separation by vacuum is achieved, of process stations to be described further on, namely sputtering systems or a plasma source, into plasma areas A, B and C to be described further on. Preferably the process stations are not connected plasmawise. The pressures, preferably the partial pressures of gases in the residual gas (sputter gas) in the apparatus can be adjusted largely independently of one another. Preferably, an inert gas such as argon Ar and a reactive gas, preferably oxygen $O_2$ are contained in the residual gas.

In the area A, a first cathode sputtering source is provided as the sputtering system 3, preferably a magnetron source system with two magnetron systems side by side, also known as a "Twinmag." The power supply can be a DC, DC pulsed or middle frequency (MF) or high frequency (HF) or a combination DC-HF power supply. Typical voltage ranges of the sputtering cathode are 400 V to 500 V. Preferably an MF source with 40 kHz is used.

In area A a sputtering material is sputtered from a target by reactive sputtering, a combination of sputtering material and oxygen is deposited at a sputtering rate depending on the working point on walls of the vacuum chamber 1 and on the substrates 2. Preferred sputtering materials are metals and metal alloys, such as Al, Nb, Hf, Ta, Ti, Zr, TiNb, and semiconductors such as Si.

In area B a plasma source 5 is arranged which produces a plasma which contains excited ions and radicals of the reactive component of the residual gas. The reactive particles act upon the deposited coating and further oxidize it. The plasma source 5 can be, for example a DC, HF, MF or DC pulse or DC+HF microwave plasma source apparatus, especially a Hall End plasma source, a hot cathode DC plasma source, a high-frequency plasma source, a medium-frequency or a pulsed DC plasma source. The energy of the plasma source 5 is adjustable, preferably to a range of 10 eV to 200 eV or also 400 eV. Preferably an ECWR (electron-cyclotron-wave-resonance) plasma source is used, in which the energy of the plasma particles can be adjusted in the plasma source, largely independently of the plasma density.

In an area A of the vacuum chamber 10, preferably between the two areas A and B, a heating device can be arranged, preferably a radiant heater with quartz radiators. Alternatively, infrared radiators can also be provided. Therewith the substrates can be heated to several hundred degrees, to 250ÿC.

Also provided is an area C in which a second cathode sputtering source 7 is placed diametrically opposite, which is preferably configured like the first cathode sputtering source 3. In an additional embodiment, additional sputtering devices and/or plasma sources are provided in the vacuum chamber.

In the space between areas A and C an optical measuring device (optical monitor) 8 is arranged for optical monitoring, by means of which optical properties of the growing layers can be determined. Preferably, transmission and/or reflection of a coating can, as is known in itself, be measured intermittently on at least one of the substrates to determine optical properties of the applied coating. Thus, the growing optical layer thickness can also be checked.

A preferably planar transporter 6 moves a substrate 2 at least once past at least one cathode sputtering source 3, 7, and past at least one station with a plasma source 5. The transporter 6 is preferably a substrate turntable with an adjustable speed of for example 1 to 100 rpm. The acceleration to high set speeds can be performed in a few steps, each time within the same area A, B and C. Instead of a planar transporter a drum-shaped device, known in itself, can be used for holding and for transporting the substrates. In this case the sputtering system and plasma source can be associated with a peripheral surface area of the drum.

Usually, one or more substrates 2 are fastened on the turntable. For the sake of clarity only one of the substrates shown as a circle in FIG. 1 is identified by a reference mark.

In the vacuum chamber 10 the substrate 22 is carried by the turntable 6 underneath the first cathode sputtering source 3. There the target is sputtered by cathode sputtering, material knocked out of the target precipitating onto the substrate. An argon gas-oxygen mixture is used as sputtering gas in a preferred embodiment of the invention, so that the coating growing on the substrate 2 is an oxide.

According to the invention the cathode sputtering process is operated such that in the area A or C, with the input of a reactive component, a compound layer of a given composition is deposited with a predetermined composition. The coating 1 is formed with at least two constituents, the reactive component $O_2$ forming one of the constituents and, the coating 1 is produced sub-stoichiometrically with respect to component $O_2$. With respect to one of the constituents, the coating 1 is deposited with a given deficit, of for example no more than 90, 80, 70, 60, 50, 40, 30 or 20 or less atomic percent of the reactive component $O_2$. Then in the area B the content of the component $O_2$ is increased in situ in coating 1, by means of plasma acting on coating 1, to the stoichiometric composition, and/or the structure of the coating is modified. Instead of the reactive component $O_2$ another reactive gas can be fed in area B.

It is especially good if the partial pressure of the component $O_2$ in the area of the cathode sputtering source 3 is adjusted during the coating of substrate 2 to a substantially constant level. It is beneficial for the partial pressure of the component $O_2$ to be regulated by controlling its flow. It is also possible constantly to adjust the oxygen partial pressure through the electrical power of the cathode sputtering source 3, the rate being kept constant to an especially high degree through the length of the target life.

Furthermore, in area A of the cathode sputtering source 3, an intensity of the plasma emission line, preferably of an emission line for the target material, of the reactive component or a combination of both, can be regulated to a substantially constant level. This can be set through the flow of component $O_2$ and/or the electrical power of the cathode sputtering source 3.

The coating properties can also be varied by varying the speed at which the substrate 2 is carried past the plasma source 5 and/or the cathode sputtering source 3.

A coating can be produced according to the invention also through a plurality of intermediate steps by sub-stoichiometric deposition/oxidation. Furthermore, multiple layers can be deposited in which alternating refraction indices are achieved along a growing total coating by varying the coating parameters in individual layers. Such multiple coatings can be deposited with control, for example, by setting the coating and/or oxidation time and/or the number of rotations and/or by controlling the layering through the optical measuring system 8 with the aid of the optical properties of the growing coating or sequence of coatings.

According to another embodiment of the invention, a coating is deposited with a given thickness on the substrate in the area A of the cathode sputtering source 3 with the addition of a given amount of the reactive component, and has less optical losses than a given minimum. In that case, in a known manner, the damping of a light wave falling on a coating is called optical loss. The optical losses can be learned from measurements of transmission and reflection. Since the stray light due to diffuse scattering is connected with the roughness of a surface, it is possible to draw conclusions concerning the surface quality from the optical losses. Preferably, the optical losses are determined according to the invention by means of the optical measuring device (optical monitor) 8. It is especially preferred that the optical monitor be a one-wavelength or multiple-wavelength spectrometer, especially a spectral photometer or ellipsometer, and with special preference a spectral ellipsometer. After a preset coating thickness is deposited, the optical losses are determined and there follows an adjustment of coating properties according to a signal from the optical monitor 8. If a spectral photometer is used, the transmission, absorption and reflection can be easily determined in a given spectral range and as a function of the coating thickness.

In what follows, a description shall be given, for a preferred embodiment of the method of the invention, of the procedure for producing a coating by reactive sputtering with a subsequent modification of the coating applied. Other procedures are also covered by the invention. A magnetron source system is used as the sputtering apparatus, with two magnetron systems placed side-by-side and two niobium targets. The targets are operated alternately in a medium frequency range, for example with a frequency of 40 kHz. Shutters are associated with both targets, whereby the sputtering apparatus can be isolated from the substrates. The plasma source, with which a shutter is also associated, is operated in a radio frequency range.

In a first step the sputtering apparatus is set to a working point at which the shutters are closed for the stabilization of the process. An inert gas and a reactive component (e.g., argon and oxygen) are admitted into the range of the sputtering apparatus. Also admitted into the range of the sputtering apparatus are an inert gas and a reactive component. The substrate carrier, for example a planar turntable, is accelerated to a set speed. In another step the plasma of the plasma source is ignited. An ignition of the sputtering plasma of the cathode sputtering apparatus then takes place and is brought to a specified power level. Then a partial pressure control is activated in the range of the sputtering apparatus. Preferably, a preset partial pressure level is stabilized through the cathode power.

In a second step the coating of the substrates is begun. For this, the shutters are opened. It has been found that only a slight change of the control parameters established at the working point by the opening of the shutters is required. A desired coating thickness can be controlled through the coating time or a number of rotations. Especially preferred is an optical measurement of the coating thickness performed in situ by the optical monitor 8.

According to the invention, the reactive depositing of a coating is performed at a working point on a characteristic curve or map which is selected according to the sputter material and the reactive component material to minimize the optical loss of the deposited coating or of the coating modified by the plasma effect. A few preferred characteristic curves are represented herewith.

Figure 2:
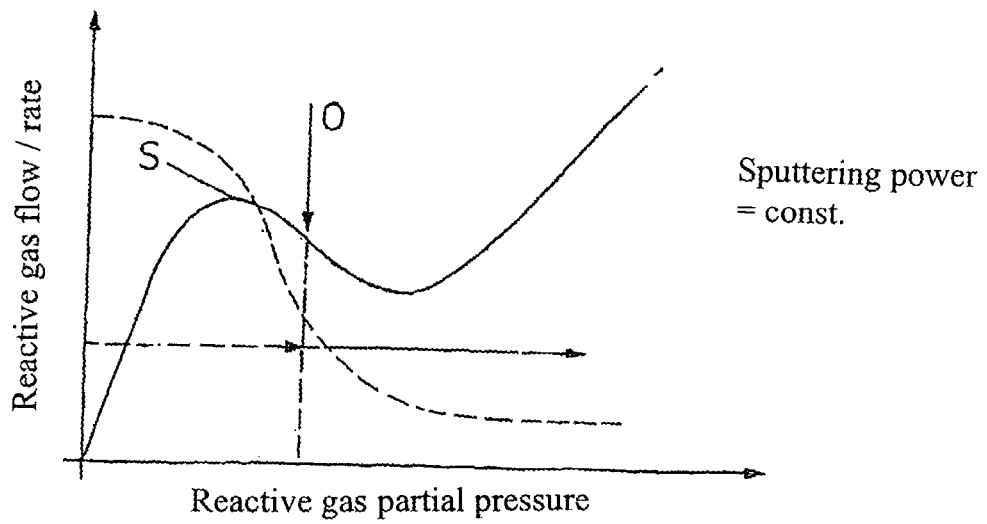
FIGS. 2 to 5 Characteristic curves in a reactive cathode sputtering.

In FIG. 2 a curve is presented to show the dependence of a reactive gas flow on a partial pressure of the reactive component in a cathode sputtering process, in an example using an aluminum target, with oxygen as the reactive component, and with a constant power in the sputtering apparatus (sputter power). At low levels of the partial pressure the oxygen flow first increases steeply and after a peak S it diminishes, in order to increase again at higher partial pressure after a minimum. At very low oxygen partial pressure a condition establishes itself with a largely metallic target surface, at which metallic coatings are deposited on the substrate. If the oxygen partial pressure increases above a level corresponding to the peak point, a transition occurs in a flow-controlled process to an oxide or compound mode, in which the target surface is completely coated with reaction products and stoichiometric coatings with undesirable coating qualities grow on the substrate. The arrow marked 0 indicates the transition to the oxide mode or compound mode. The broken curve in FIG. 2 describes the corresponding deposition rate. It is apparent that it is maximum at a low reactive gas partial pressure and decreases at increasing reactive gas partial pressure, until it comes into a saturation area parallel to the abscissas. Coming from the oxidic, the transition into the metallic range first takes place at lower oxygen partial pressures, so that the curve shows a hysteresis. The range between the apex and the minimum of the curve is generally inaccessible without complicated regulating measures, but permits the deposition of less than stoichiometric coatings at a high rate. The method of the invention is practiced preferably in a given portion of the characteristic curve with increasing or decreasing gas flow close to the apical point S, since there relatively high sputtering rates can be reached. Especially preferred is the range close to the apex S of the characteristic, with a flow of the first gas component $O_2$, which in the deposition of layer 1 is no more than 50% below the maximum at the apex S, and with special preference no more than 20% to 10% below the maximum at the apex S. In this range a high deposition rate of a sub-stoichiometric coating is achievable, which then is exposed to plasma action. Depending on the material, e.g., with Ti, Nb, TiNb, it is possible according to the invention to operate in the transition range to the right of the peak S, while for other materials, e.g., Al, Si, the range to the left of peak S is preferred.

Figure 3:
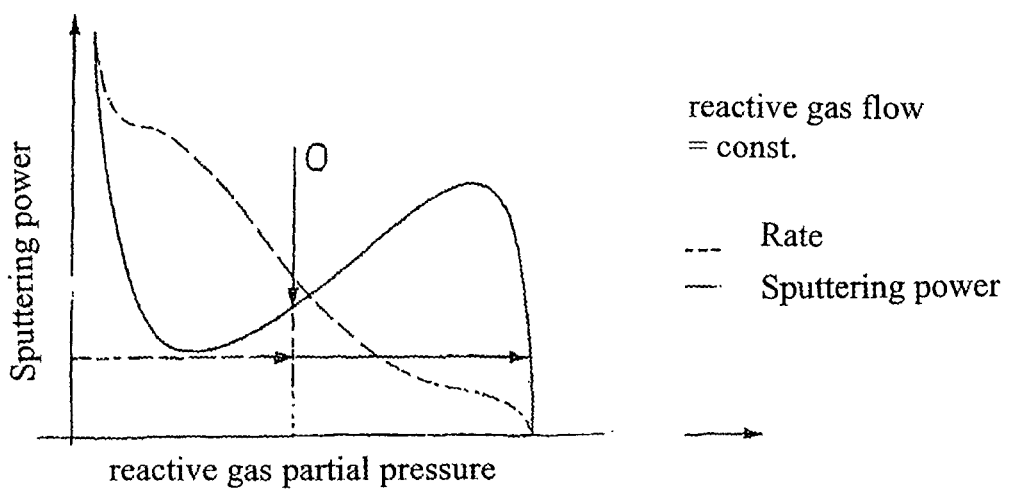

In FIG. 3 a curve is similarly represented for a reactive gas flow that is held constant, at which a set value of a reactive gas partial pressure is established by means of the sputtering power. The sub-stoichiometric range is on the left of the arrow marked 0. In this control method the sputtering is done, preferably but not exclusively, in a range around the minimum of the characteristic.

Figure 4:
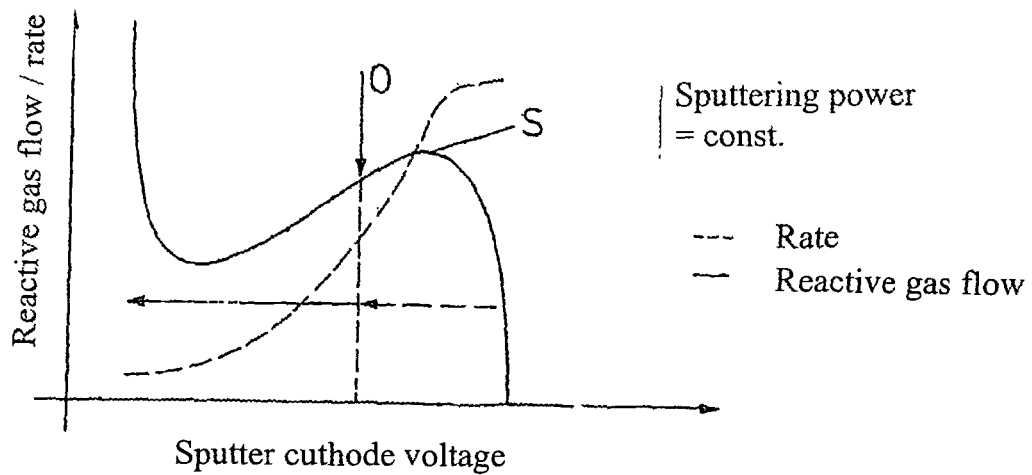

In FIG. 4 another curve is represented, in which, at constant sputtering power, a target value of a sputtering cathode voltage is established by means of a reactive gas flow, and in the area on the right of the transition marked 0 is set to a sub-stoichiometric compound. Preferred here is an area around the peak S of the transition.

Figure 5:
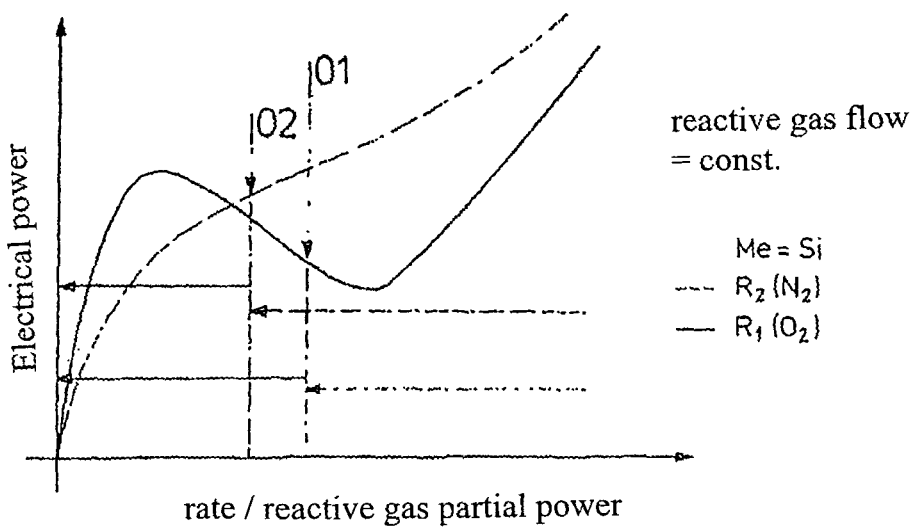

A constant reactive gas flow is used in the case of the curve in FIG. 5, a target value of a quotient of the sputtering rate and a reactive gas partial pressure is regulated by means of the electrical power of the sputtering apparatus to a predetermined set value. The solid curve here identifies the characteristic line in the case of oxygen as reactive gas, while the broken curve identifies the characteristic with nitrogen as reactive gas. The arrows marked O1 and O2 indicate the transition from a sub-stoichiometric regime on the right of the transition to a stoichiometric regime left of the transition, for oxygen and nitrogen, respectively, as reactive gas. It can be seen that the location of this transition depends on the reactive gas used. Also, in the case of oxygen, the minimum is on the right of the said transition at O1, and in the corresponding characteristic for nitrogen it vanishes; to this corresponds an absence of a hysteresis. The quotient of sputter rate and reactive gas partial pressure can be determined from a quotient of a material and reactive gas partial pressure plasma line intensity. Material in this case means the material of the sputtering cathode; silicon in the present case. A two-line measurement of this kind has the advantage that the result is relatively independent of any contamination of a light conductor entry window through which the corresponding emission lines are measured.

Typical values for the present invention are 40 sccm/min for the argon flow and 30 sccm/min for the oxygen flow in the area of the sputtering system. An oxygen partial pressure is determined preferably from the signal from a lambda probe in the area of the sputtering system. The typical power of such a dual magnetron cathode station in the process of the invention is in the range of 20 sccm/min, while the argon flow is in a range of 2 sccm/min. The power in case of an RF operation is in a range of 1 KW.

To control the sputtering system 3, 7, and the plasma source 5 as well as the moving of the substrates a control unit is provided which is not shown in the drawings. The control takes place in a parameter area in which characteristic curves and characteristic maps are plotted, as already explained more precisely. In a preferred embodiment of the invention a signal from the optical monitor 8 is used in order to establish the working parameters for optimizing the optical quality, especially so as to minimize the optical losses of the deposited coating. This is done preferably on line. Likewise, such procedure is performed layer by layer or upon a changeover from one layer to the next. Especially preferred is the use of an optical signal for the performance of a control regulation to allow for long-term drifting of the coating properties, such as transmission, reflection, and/or optical losses. Also, the operation of the entire apparatus comprising the sputtering system 3.7 and the plasma source 5, in regard to optical properties of the deposited and modified coating, or in regard to the speed of the production of the coating. For this purpose, for example, appropriate working points are selected on a characteristic line by means of the control system, followed by plasma action and an optimization value is determined.

Optical monitoring can take place directly after each sputtering by the sputtering system 3, 7, and/or after a plasma application by the plasma source 5 on at least one substrate.

Figure 6:
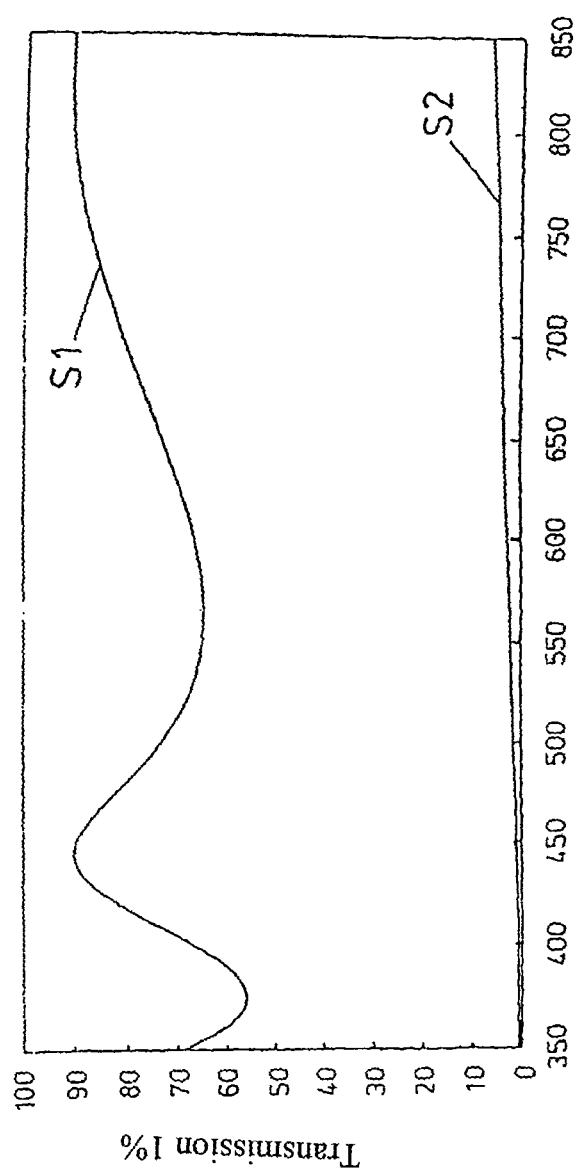
FIG. 6 An example of the optical transmission of a coating as a function of the wavelength, with and without the substrate speed, as parameters of the set of curves.

FIG. 6 shows an example of the optical transmission of a coating produced by the method of the invention as a function of wavelength (upper curve $S_1$) in comparison with a coating which was not exposed after sub-stoichiometric deposition to the oxygen plasma from the plasma source 5 (lower curve $S_2$). The coating parameters of the two layers are the same except for the oxidation near the plasma source 5. The sub-stoichiometric coating shows a very low transmission, but very high losses, so that it is unusable as an antireflection coating or filter or the like. It can be seen plainly that oxidation by the plasma action permits a very effective improvement of the coating properties (upper curve $S_1$).

Figure 7:
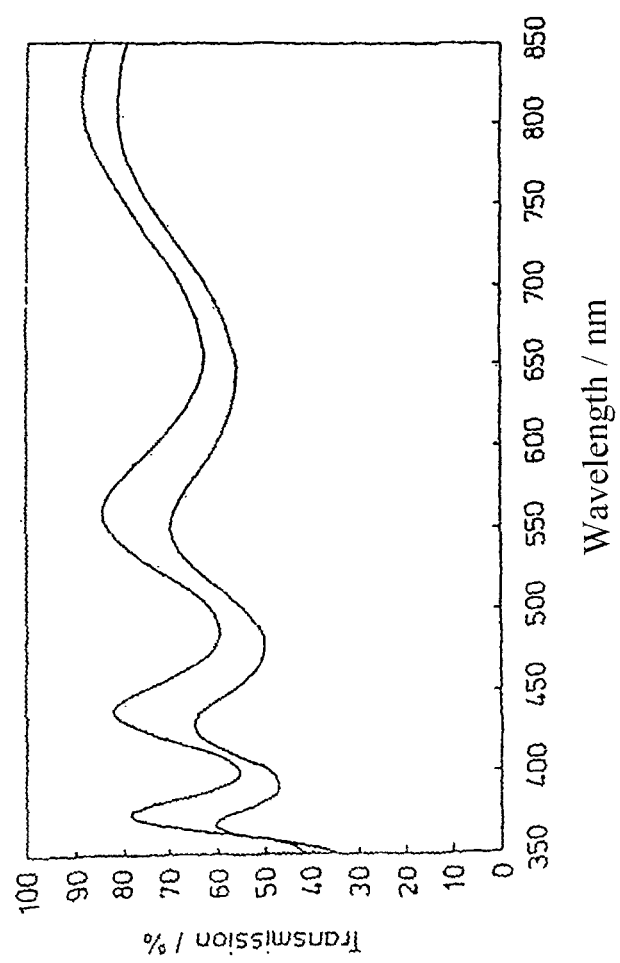
FIG. 7 An example of the optical transmission of a coating as a function of wavelength with the substrate speed as a parameter of the set of curves.

FIG. 7 shows an example of the optical transmission of a coating as a function of wavelength, with a substrate speed as a parameter of the curves. At a high speed of, e.g., 180 or 120 rpm, the optical transmission of the coating is higher (upper curve) than with only half the speed of, e.g., 60 rpm (lower curve).

Figure 8:
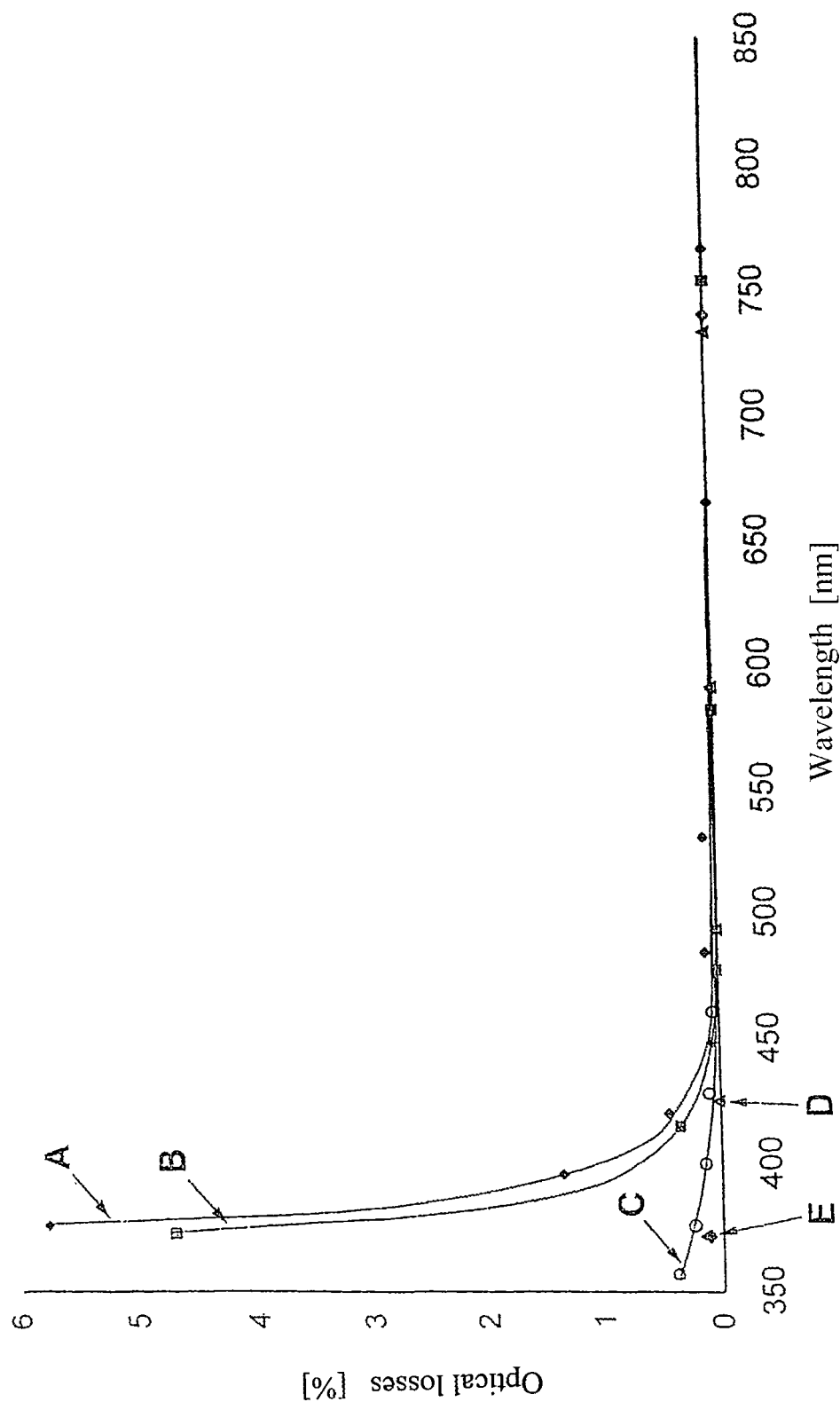
FIG. 8 Shows examples of optical losses of individual layers with different coating thicknesses.

FIG. 8 shows examples of single-layer coatings of various thickness which were made according to the invention. Curves A and B identify $Nb_2O_5$ coatings with a thickness of 1,000 nm to 500 nm. Curve C identifies a $Ta_2O_5$ single layer with a thickness of 1,000 nm. Curves D and E identify $SiO_2$ coatings with thicknesses of 1,000 nm and 500 nm, respectively. It can be seen that the optical losses of the material used depend on the coating thickness and the wavelength. All in all the optical losses are very slight and increase only near the absorption edge of the material in question.

Single layers of a high-refracting material, such as $Nb_2O_3$, $Ta_2O_5$, $TiO_2$, $ZrO_2$, $Al_2O_3$ require for a low optical loss a deposition in the reactive sputtering with only a slight oxygen deposit, the coatings being thereafter exposed to the reactive plasma of the plasma source. The energy of the particles of the reactive plasma of the plasma source 5 is preferably lower than 50 eV. For low-refraction single layers such as $SiO_2$ can also be obtained with a greater oxygen deficit in the reactive sputtering followed by the action of the reactive plasma of the plasma source.

According to the invention, an excellent optical quality of the coatings results if they are first made sub-stoichiometrically with a defined oxygen deficiency and are then oxidized by plasma action to the stoichiometric oxide. Typically, 0.2 to 0.4 nm are deposited per revolution. The deposited coating is preferably X-ray amorphous or nanocrystalline with a smooth surface, but at the same time has a dense texture free of voids, so that the prevention of water entry from the atmosphere is achieved, which otherwise would lead to unwanted refraction changes. The improved surface texture is to be attributed substantially to the plasma action which to this extent can replace any treatment of the substrate with a bias voltage common in the state of the art.

Figure 9:
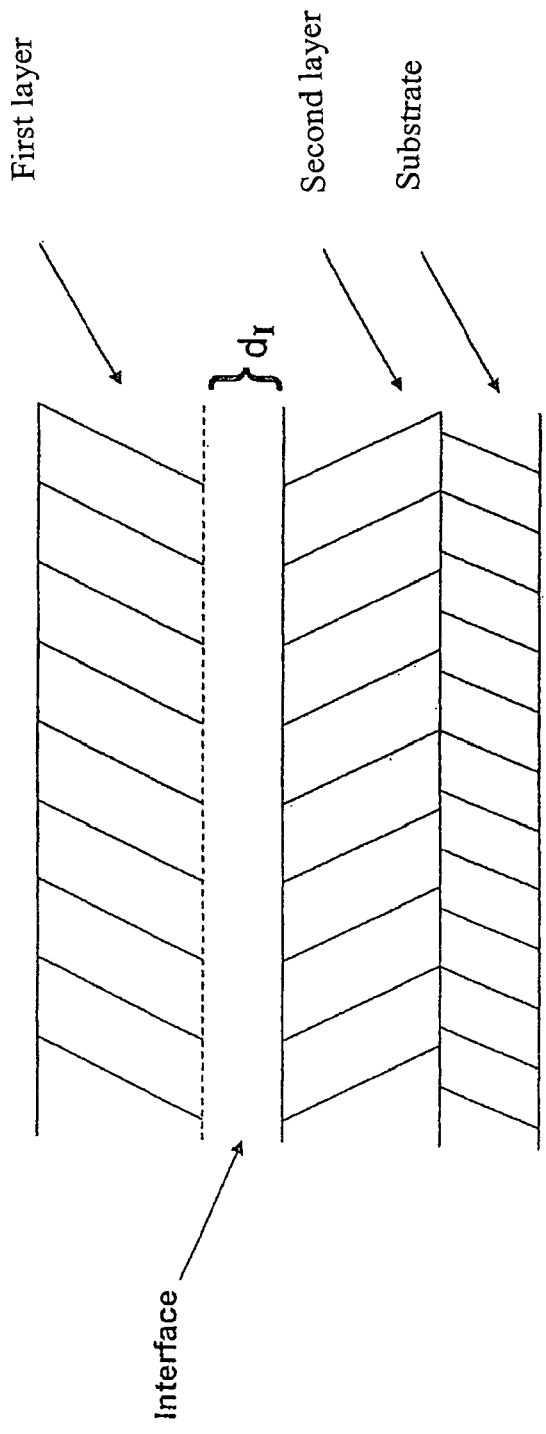
FIG. 9 The structure of a multilayer coating with interface.

In the production of low-loss multilayer coatings according to the invention, in which a deposit of a second layer containing at least one reactive component on a first layer is performed by means of a reactively operated coating apparatus, an alteration of the texture and/or stoichiometry of the coatings is likewise provided by means of a reaction system. The first layer can also be substrate. A schematic representation of a multi-layered coating on a substrate, with a first layer, a second layer and an interface of the thickness d in an area of the second layer adjoining the first layer is shown in FIG. 9. The coating apparatus can be any reactively operated coating apparatus, especially apparatus which operate on the principle of physical vapor deposition, such as vapor depositing or sputter technologies. The reaction apparatus is a plasma source, e.g., a DC, HF, MF or DC pulse or DC plus HF or microwave plasma apparatus.

Preferred are multi-layer coatings of alternating high- and low-refraction layers, such as are used especially for optical filters. The multilayer coatings can also consist of alternating high-, low- and medium-refracting layers. A layer with an index of refraction substantially greater than 1.9, preferably between 1.9 and 2.6, is considered as a high-refraction layer.

A coating with a refractive index between 1.3 and 1.5 is considered to be low-refraction. Medium-refraction coatings have a refraction index Examples of high-refraction materials in this sense are, for example, $Nb_2O_5$, $Ta_2O_5$, or $ZrO_2$. Coatings of $SiO_2$, for example, are considered low-refraction.

Figure 10:
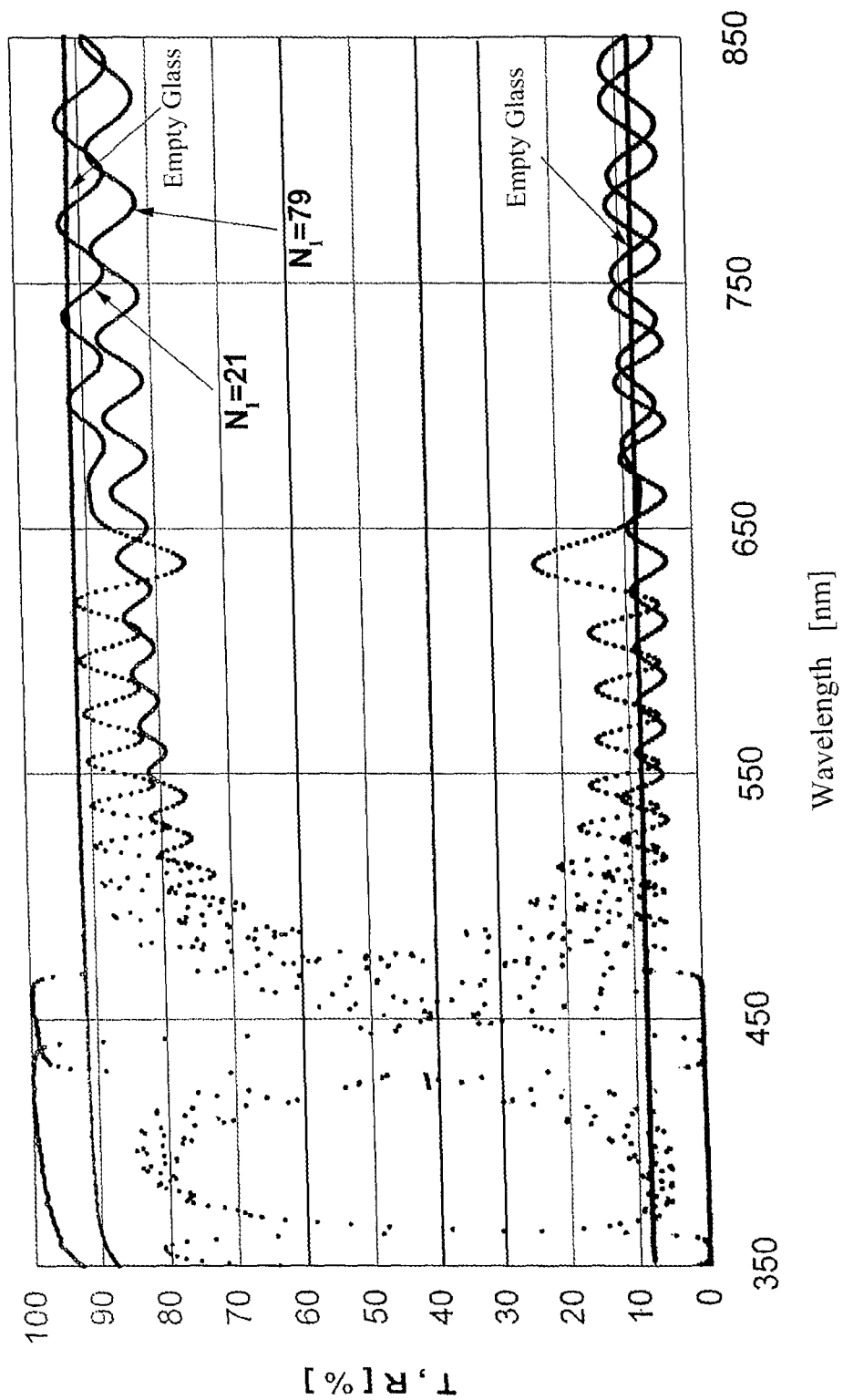
FIG. 10 The influence of the number of interfaces in a multilayer coating on transmission and reflection.

In FIG. 10 are shown transmission and reflection values with a number of $N_1=21$ and $N_1=79$ interfaces for $Nb_2O_2/SiO_2$ multilayer coatings in relation to wavelength. From the figure it can be seen that with a growing number of interfaces or of layers of the multilayer coating the optical losses increase.

The depositing of the coatings as well as the alteration of the texture and/or stoichiometry of the layers is performed preferably by the method described further above, yet other methods can also be practiced. To lower the optical loss of the multilayer coating below a given level, an interface with a thickness d1 is created in an area of the second layer adjoining the first layer, preferably by means of the coating apparatus, and with a value of a deficit DEF of the reactive component lower than a value $DEF_1$.

It is preferred in the method of the invention if the thickness $d_1$ of the interface exceeds a minimum value. The rest of the deposited layer can be deposited reactively with a higher deficit DEF.

With special preference the interface is produced by operating the reaction apparatus with a stoichiometry as perfect as possible.

Preferentially in the described process a low-refraction coating of SiO2 is deposited on a high-refraction coating, for example, $Nb_2O_5$, $Ta_2O_5$ or the like. Carbon or oxygen also can be used as the reactive component. A high-refraction layer can again be deposited on the low-refraction layer.

A multilayer coating according to the invention can be produced in different ways. It is especially simple if values of a momentary thickness d(t) of the second layer are determined and, as soon as d(t) is greater than a value $d_1$, the deposition of the second layer is begun with a value of the reactive component deficit DEF is greater than $DEF_1$. The values of the momentary thickness d(t) of the second layer can be determined during the deposition of the second layer, for example according to a monitoring signal from the optical monitoring system (8).

Figure 11:
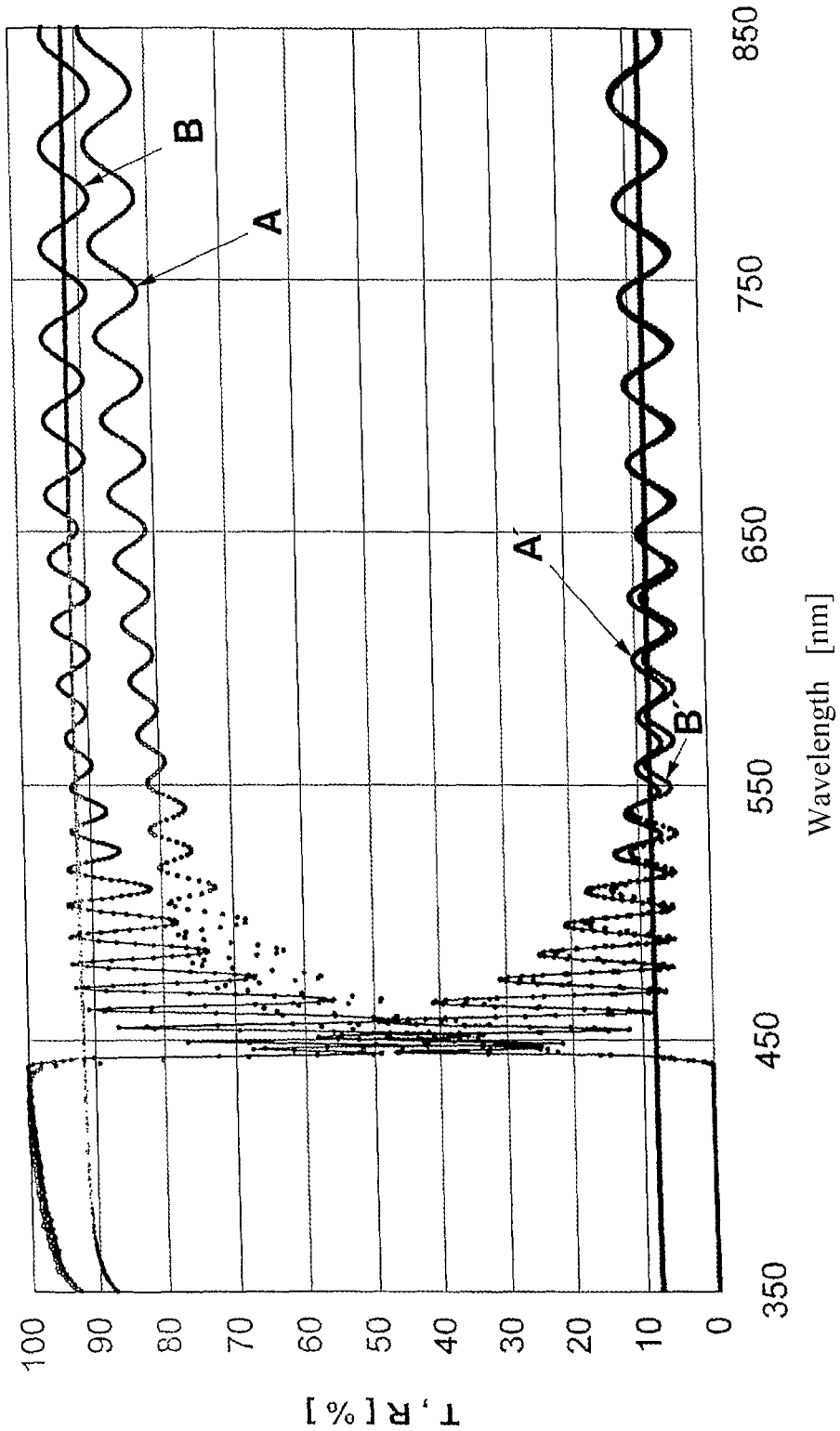
FIG. 11 The effect of minimizing the optical losses for a multilayer coating according to the method of the invention.

In FIG. 11 is shown the effect of minimizing the optical loss for a multilayer coating made by the method of the invention. In a $Nb_2O_5/SiO_2$ multilayer coating, the interfaces have been deposited with different oxygen deficits. A and Aÿ represent the reflection and transmission values in relation to wavelength for a multilayer coating with a relatively great oxygen deficit at the interface, while B and Bÿ are the transmission and reflection values with a relatively low oxygen deficit at interface. Curves A and Aÿ show greater optical losses than curves B and Bÿ.

Figure 12:
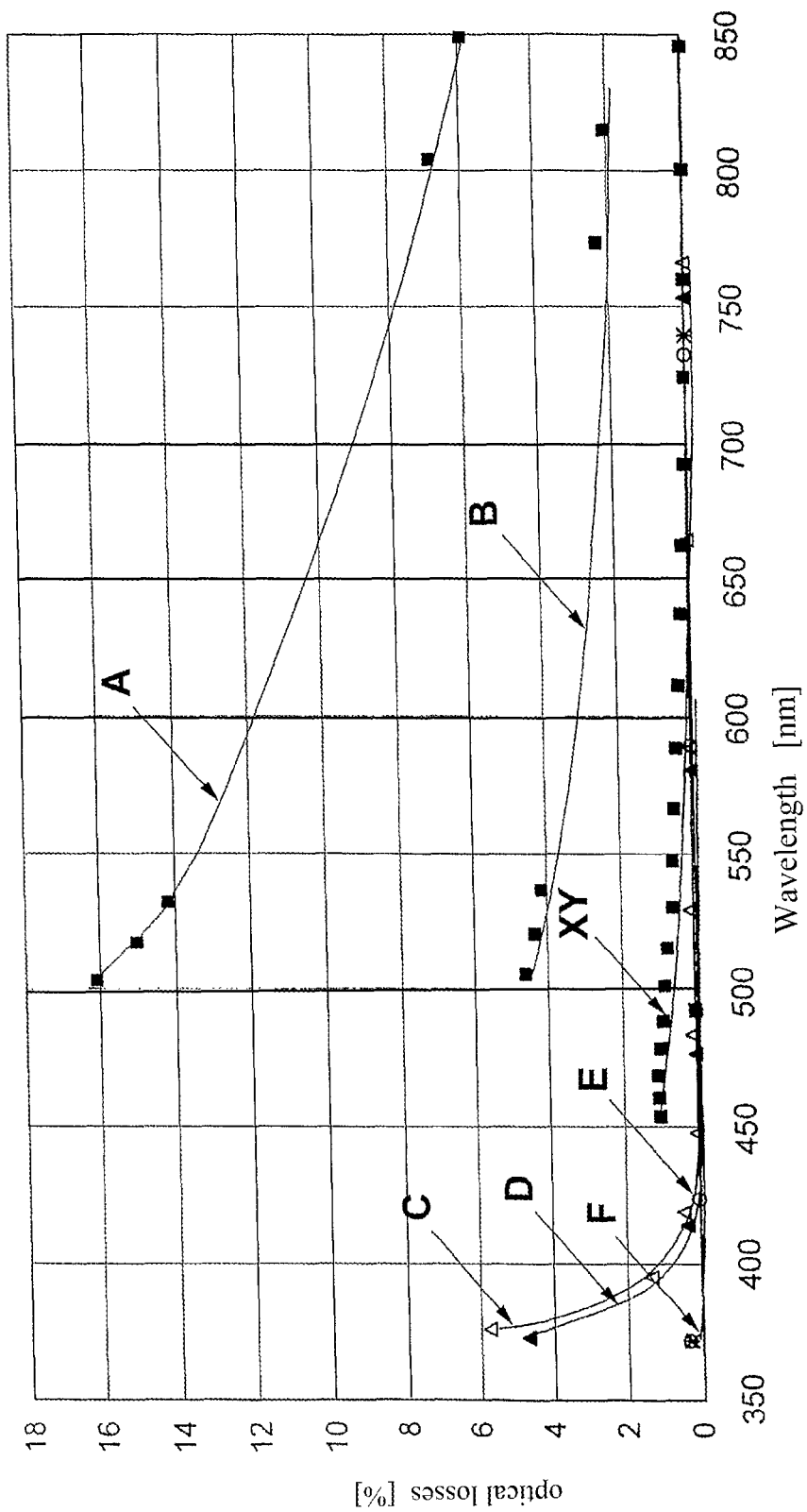
FIG. 12 Optical losses for single and multiple layer coatings of material of high and low refraction and for different coating thickness; the curves marked A and B correspond to multilayers with 77 and 21 interfaces without interface optimization; the curves marked C, D, E, F, correspond to single coatings; a multilayer coating and 77 interfaces and interface optimization is identified by XY.

In FIG. 12, to further illustrate the method of the invention for single layers of high- and low-refraction material and for multiple layer coatings with alternating optical layers of high and low refraction, optical losses are plotted in FIG. 12 in relation to wavelength. Here the values for a multilayer coating with 77 non-optimized interfaces are indicated at A, while values of an otherwise equal multilayer coating are given at B. The losses of B are lower than those of A, because the number of interfaces is only 21 compared with 77. The values of a multilayer coating comparable to A, however, but with optimized interfaces, are indicated by XY. The curve XY shows extremely lower losses compared with curve A for the corresponding multilayer coating. Curves C, D, e and F designate high- and low-refraction single layers with a thickness of 1,000 nm and 500 nm, respectively.

Figure 13:
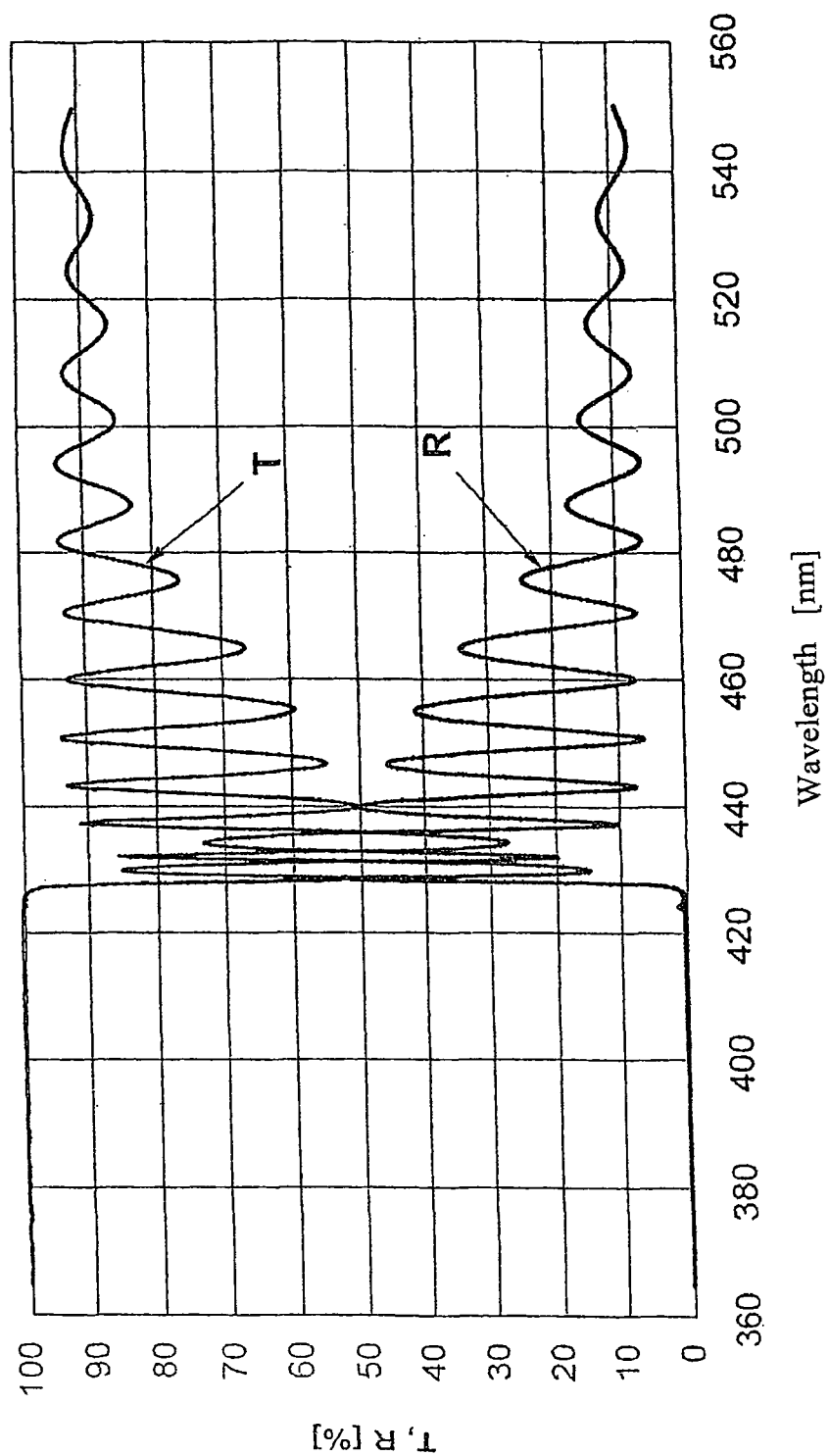
FIG. 13 Transmission and reflection for a multilayer coating with low optical losses, for wide band filters, for example.

FIG. 13 shows transmission and reflection in relation to wavelength for a $N_2O_5/SiO_2$ multilayer coating which is made by the method of the invention to achieve the lowest optical losses. If the transmission and reflection of a filter is measured in relation to wavelength, the filter has places of maximum and minimum transmission. At the maximum transmission points the reflection is minimal and vice versa. At these points the losses can most easily be determined: by subtracting from 100% Tmax and Rmin or Tmin ant Rmax. A multilayer coating according to FIG. 13 is designed preferentially for broadband filters.

Figure 14:
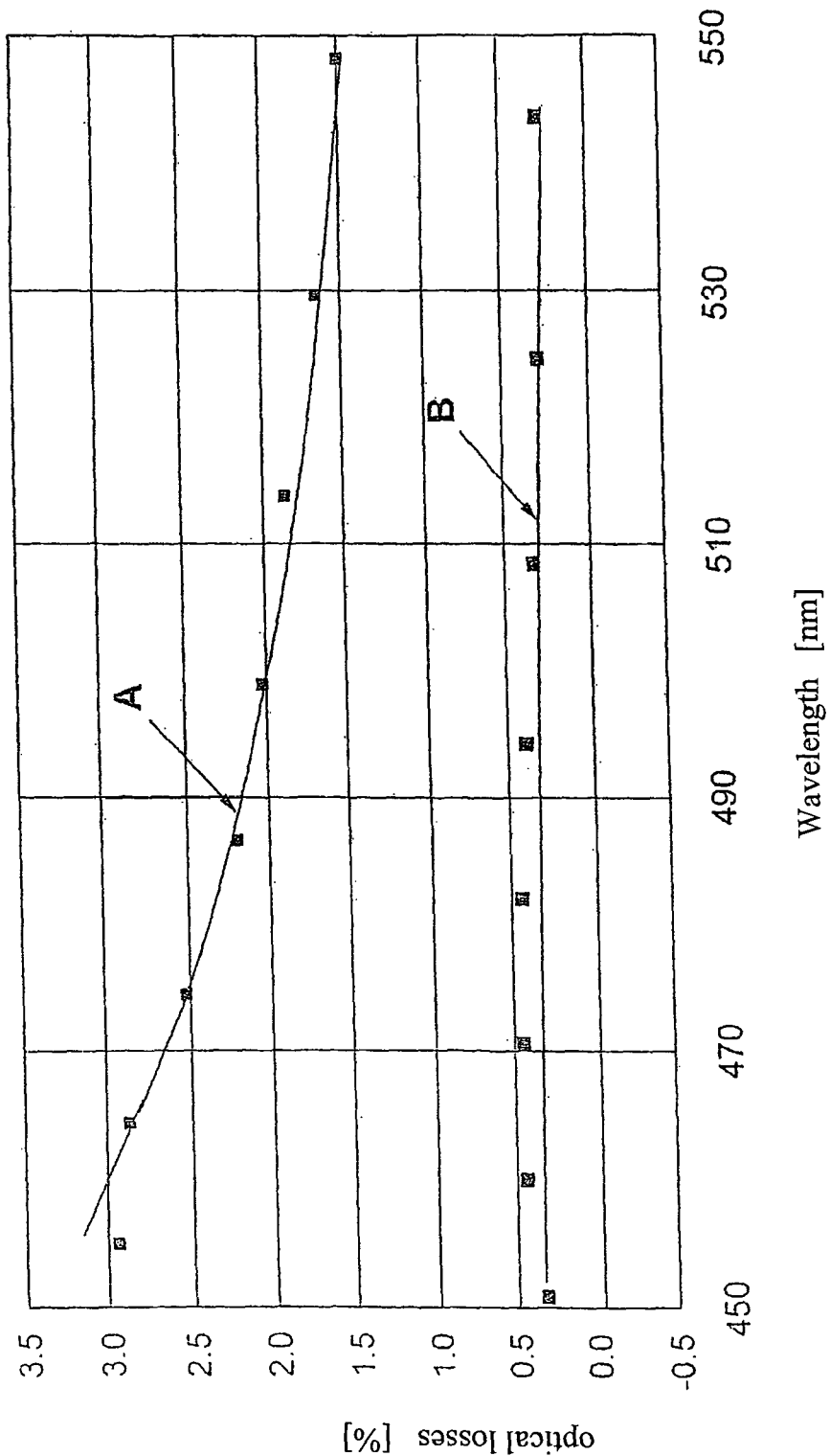
FIG. 14 Optical losses for a multilayer coating for various thicknesses of an interface. A corresponds to a thickness of 2.7 nm, B to a thickness of 3.6 nm.

FIG. 14 illustrates, for a $SiO_2$ interface layer on a high-refraction coating, the effect of a variation of the thickness d of the interface layer on the optical losses in relation to wavelength. The curve marked A gives values for a 1.7 mm thick interface layer which shows a clear relationship to wavelength. In comparison, the values for a 3.6 mm thick interface layer is marked B and shows considerably lower optical losses as well as a considerable independence from the wavelength in the range represented. In FIG. 14 it is furthermore apparent that a critical thickness of the interface layer exists, after which a clear reduction of the optical losses occurs if the value of the deficit of reactive component DEF is made less than a critical value $DEF_1$. In the case of a low-refraction layer SO$_2$ on a high-refraction layer, e.g., Nb$_2$O$_5$, the critical value is in a range between 2.5 and 10.0 nm, preferably 2.6 nm, 27 nm . . . 3.6 nm, 3.7 nm, 3.8 nm. The deficit DEF=2−x of the reactive component is then to be chosen relatively low, corresponding to a value x of the reactive component of SO$_x$ in the area of the interfaces of more than 1.5, 1.6 . . . to 1.8.

In a preferred embodiment of the method, in order to produce the SiOx coating in the interface area, at first relatively thin layers are produced per rotation of the substrate plate at relatively low sputtering power and a relatively low oxygen deficit. Preferably reactive sputtering is performed in the area of transition to the oxide mode. After reaching a coating thickness, which can be preset, of for example 3.6 nm, the SiOx coating is deposited with a relatively great oxygen deficit at a higher power and exposed to the reactive plasma from the plasma source. This [plasma] is preferably constant.

Figure 15:
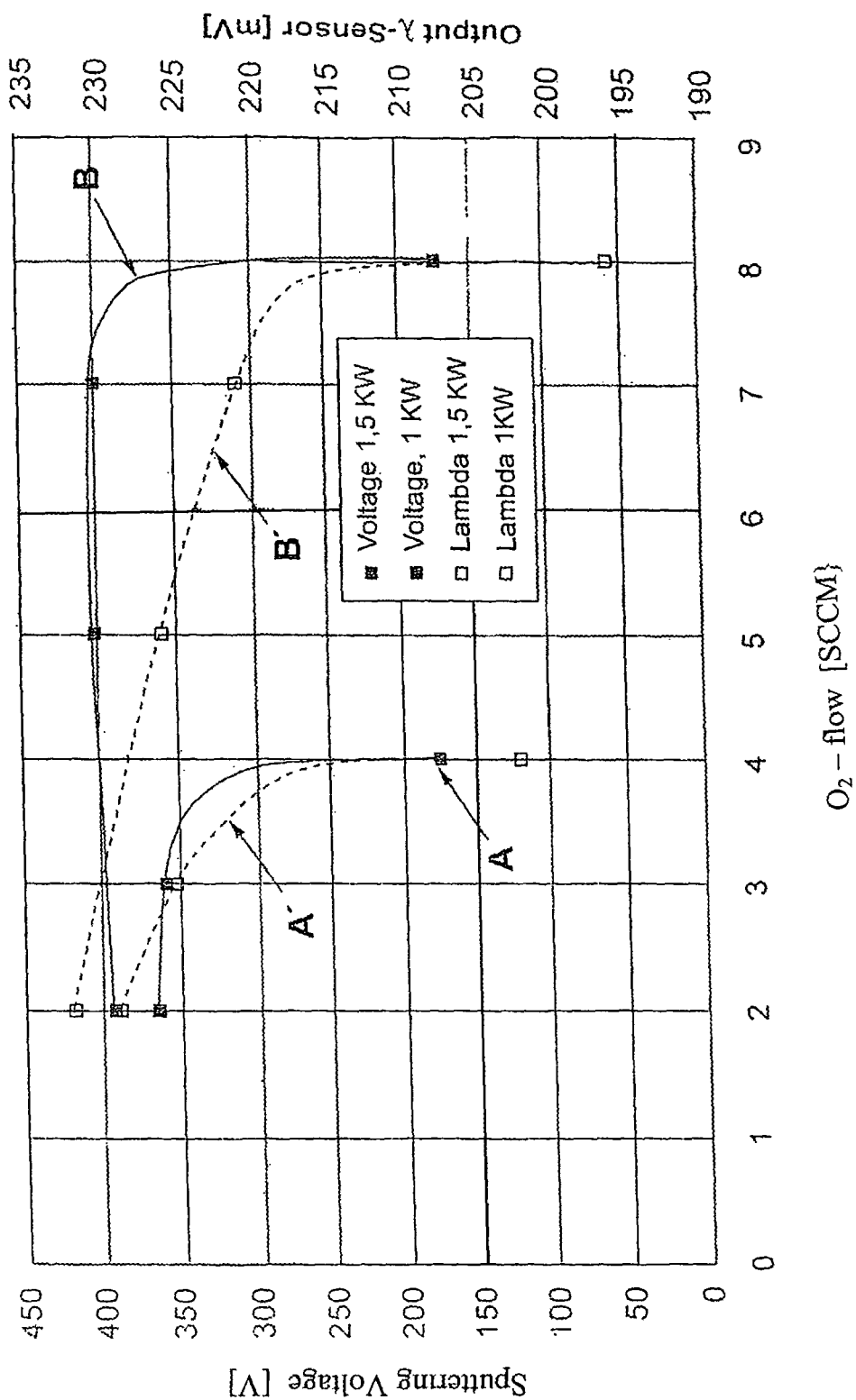
FIG. 15 Characteristic curves in the case of a reactive cathode sputtering of silicon at powers of 1 KW and 1.5 KW.

In FIG. 15, curves are shown for the reactive deposition of the interface coating at a lower and greater deficit. The figures for the sputtering voltage and initial power of a lambda sensor at 1 kW are indicated at A and Aÿ, and figures for the sputtering voltage and the lambda signal at a sputtering power of 1.5 kW are given at B and Bÿ. The energy of the coating particles is preferably between a few eV up to 200 eV. It is preferred if the particles of the reactive plasma have an energy of less than 50 eV.

Figure 16:
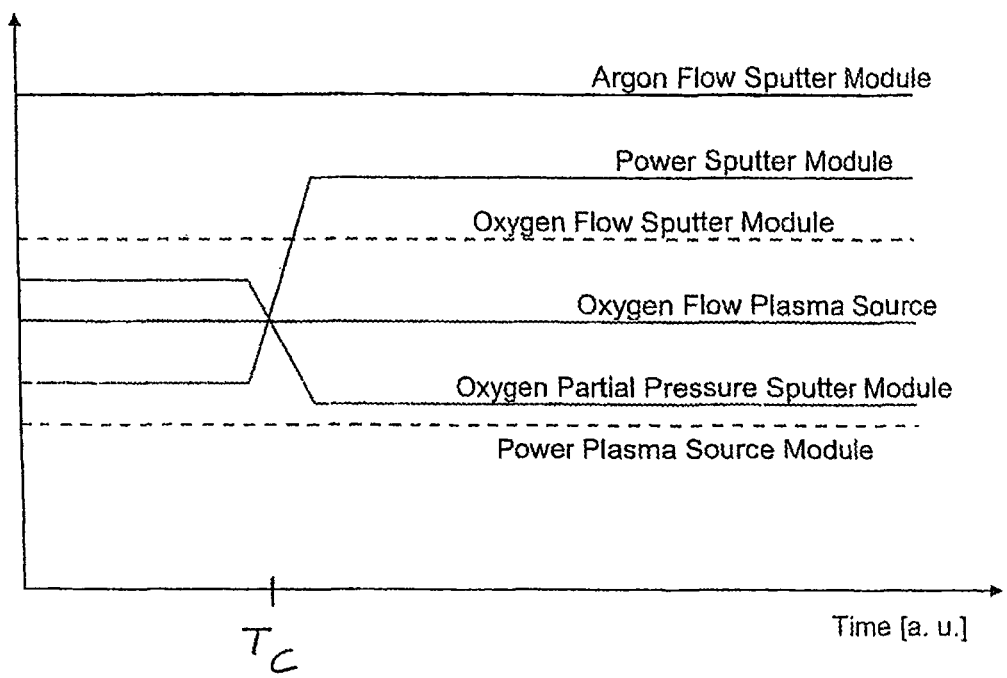
FIG. 16 Curves of various process parameters in a reactive cathode sputtering of silicon.

In FIG. 16, the time curves of important process parameters during reactive cathode sputtering with oxygen as a reactive component are represented schematically, as used in a preferred embodiment of the process. In this case the operation is performed at constant values of the plasma source power, of the argon flow in the area of the sputtering apparatus and of the oxygen flow in the rea of the sputtering source and plasma source. At a moment $T_c$ the power of the sputtering system is increased. From this moment $T_c$ the oxygen partial pressure in range of the sputtering apparatus is reduced. Preferably, at the moment $T_c$ a specified coating thickness of, e.g., 3 nm is reached. The coating sputtered up to this moment has a relatively low oxygen deficit. Layers sputtered after the moment $T_c$ have a relatively high oxygen deficit. It is understood that, in further embodiments of the invention, the parameter values of other factors than those of the sputtering power and oxygen partial pressure can vary differently time-wise in the area of the sputtering apparatus.

By the deposition of relatively thin SiOx coatings with a relatively low oxygen deficit it can be assured that both the interface layer and the layer, for example of Nb$_2$O$_5$, underneath it, by dint of the action of the reactive plasma source following the SiOx deposition, can be a stoichiometric coating. Especially it can be achieved by such a procedure that any eventual withdrawal of the reactive component, especially the oxygen, can be compensated by the reactive SiOx from the layer beneath it (Nb$_2$O$_5$) due to the action of the plasma source. If on the other hand the SiOx is deposited at too high a rate, it is possible by the reactive plasma action to oxidize to a stoichiometric SiO$_2$, but it becomes under certain circumstances so dense that a sufficient penetration of the action of the plasma source to achieve stoichiometry of the layer underneath it to the layer under the SOx layer is not possible. After a certain thickness of the interface layer applied with a slight oxygen deficit, SiOx applied anew onto the already deposited layer can withdraw no more oxygen from the layer underneath it, so that the further deposition of SiOx with a higher deficit of oxygen can take place.

The invention claimed is:

1. An apparatus for producing a coating on a substrate comprising:
   a vacuum chamber divided by one or more diaphragms into at least a first region and a second region arranged at a predetermined distance from the first region, wherein each of the first and second regions is configured to receive a flow of a residual gas containing a reactive component selected from the group consisting of oxides, carbides, nitrides, or mixtures thereof, wherein the first and second regions are connected to one another only by a slit extending through a diaphragm of the one or more diaphragms;
   a heating device positioned between the first and second regions, wherein the heating device is a radiant or infrared heating device;
   a probe within the first region configured to measure a partial pressure of the reactive component;
   a sputtering device in the first region that includes a sputtering source in electrical communication with a power source configured to operate with an alternating electric field in a high-frequency or medium frequency range, the sputtering device being configured to sputter a sputtering material comprising a metal or metal alloy;
   a control unit configured to control a first partial pressure of the reactive component measured by the probe within the first region during sputtering of the sputtering source by:
     adjusting a flow rate of the residual gas while sputtering power supplied by the power source is held constant to cause the measured first partial pressure to achieve a first working point on a first characteristic curve of flow rate as a function of reactive gas partial pressure; or
     adjusting the sputtering power supplied by the power source while the residual gas flow rate is held constant to cause the measured first partial pressure to achieve a second working point on a second characteristic curve of sputtering power as a function of reactive gas partial pressure;
   wherein the first partial pressure at the first or second working points is in an area of transition between a metallic mode and a compound mode that is selected to form a sub-stoichiometric coating having a composition with a predetermined stoichiometric deficit on the substrate;
   a transporter device comprising a rotatable flat plate for fastening the substrate thereon and moving the substrate with the sub-stoichiometric coating from the first region to the second region; and
   a plasma source in the second region for modifying texture and/or stoichiometry of the sub-stoichiometric coating to form a modified coating via a plasma treatment with a predetermined amount of the residual gas including the reactive component at a second partial pressure to reduce an optical loss in the modified coating,
   wherein the first partial pressure of the reactive component in the first region is set independently of the second partial pressure of the reactive component in the second region.

2. An apparatus for producing a coating on a substrate comprising:
   a vacuum chamber divided by one or more diaphragms into at least a first region and a second region arranged at a predetermined distance from the first region, wherein each of the first and second regions is configured to receive a flow of a residual gas containing a reactive component selected from the group consisting of oxides, carbides, nitrides, or mixtures thereof, wherein the first and second regions are connected to one another only by a slit extending through a diaphragm of the one or more diaphragms;
a heating device positioned between the first and second regions, wherein the heating device is a radiant or infrared heating device;
a probe within the first region configured to measure a partial pressure of the reactive component;
a sputtering device in the first region that includes a sputtering source in electrical communication with a power source configured to operate with an alternating electric field in a high-frequency or medium frequency range, the sputtering device being configured to sputter a sputtering material comprising a metal or metal alloy;
a control unit configured to control a first partial pressure of the reactive component measured by the probe within the first region during sputtering of the sputtering source by:
 adjusting a flow rate of the residual gas while sputtering power supplied by the power source is held constant to cause the measured first partial pressure to achieve a first working point on a first characteristic curve of flow rate as a function of reactive gas partial pressure; or
 adjusting the power supplied by the power source while the residual gas flow rate is held constant to cause the measured first partial pressure to achieve a second working point on a second characteristic curve of sputtering power as a function of reactive gas partial pressure;
wherein the first partial pressure at the first or second working points is in an area of transition between a metallic mode and a compound mode that is selected to form a sub-stoichiometric coating having a composition with a predetermined stoichiometric deficit and having an optical loss below a predetermined minimum at a predetermined coating thickness;
a transporter device comprising a rotatable flat plate for fastening the substrate thereon and moving the substrate with the sub-stoichiometric coating from the first region to the second region; and
a plasma source in the second region for modifying structure and/or stoichiometry of the sub-stoichiometric coating to form a modified coating with a predetermined amount of the residual gas including the reactive component at a second partial pressure to reduce an optical loss in the modified coating,
wherein the first partial pressure of the reactive component in the first region is set independently of the second partial pressure of the reactive component in the second region.

3. The apparatus of claim 2, further comprising a gas supply and/or a pump unit arranged in the vicinity of said sputtering device and said plasma source and having a pass-through for at least one substrate.

4. The apparatus of claim 2, wherein the substrate is arranged on the transporter device so as to be spaced away from said sputtering device and said plasma source.

5. The apparatus of claim 4, wherein several substrates are arranged on the transporter device.

6. The apparatus of claim 4, wherein said sputtering device and said plasma source are arranged to correspond to a circumference of the transporter device.

7. The apparatus of claim 2, further comprising a second sputtering device in a third region of the vacuum chamber, the second sputtering device being disposed diametrically opposite the sputtering device in the first region.

8. The apparatus of claim 7, wherein said plasma source is arranged spatially between said two sputtering devices.

9. The apparatus of claim 7, further comprising an optical measuring device, arranged spatially between said two sputtering devices, for measuring an optical transmission, reflection and/or loss of a coating deposited on the substrate.

10. The apparatus of claim 7, further comprising at least one optical measuring device disposed spatially between said two sputtering devices.

11. The apparatus of claim 9, wherein said optical measuring device is a one-wavelength or multiple wavelength photometer and/or ellipsometer.

12. The apparatus of claim 2, wherein said sputtering device is a magnetron-supported cathode sputtering source.

13. The apparatus of claim 2, wherein said plasma source is one of the following: an electron-cyclotron-wave-resonance (ECWR) source, a Hall End plasma source, a hot cathode DC plasma source, a high-frequency plasma source, a medium-frequency or pulsed DC plasma source.

14. An apparatus for producing a multilayer coating, comprising:
a vacuum chamber divided by one or more diaphragms into at least a first region and a second region arranged at a predetermined distance from the first region, wherein each of the first and second regions is configured to receive a flow of a residual gas containing a reactive component selected from the group consisting of oxides, carbides, nitrides, or mixtures thereof, and wherein the first and second regions are connected to one another only by a slit extending through a diaphragm of the one or more diaphragms;
a heating device positioned between the first and second regions, wherein the heating device is a radiant or infrared heating device;
a probe within the first region configured to measure a partial pressure of the reactive component;
at least one sputtering device in the first region that includes a sputtering source in electrical communication with a power source configured to operate with an alternating electric field in a high-frequency or medium frequency range;
at least one plasma device in the second region; and
a control system;
wherein the at least one sputtering device is operable to deposit a second layer with at least one reactive component on at least one substrate including a first layer moving within a flat plane relative to the at least one sputtering device and the at least one plasma device;
wherein the plasma device is operable to change texture and/or stoichiometry of at least one layer; and
wherein said control system is configured to:
 control the at least one sputtering device and the at least one plasma device to form an interface layer, in a region of said second layer adjoining the first layer, with a thickness $d_1$ and a predetermined composition having a deficit of said at least one reactive component having a value DEF lower than a value $DEF_1$; and
 control the at least one sputtering device to form the second layer adjoining the interface layer with a value DEF higher than the value $DEF_1$ by controlling a first partial pressure of the reactive component measured by the probe within the first region during sputtering of the at least one sputtering device, wherein the first partial pressure is controlled by:

adjusting a flow rate of the residual gas while sputtering power supplied by the power source is held constant to cause the measured first partial pressure to achieve a first working point on a first characteristic curve of flow rate as a function of reactive gas partial pressure; or adjusting the sputtering power supplied by the power source while the residual gas flow rate is held constant to cause the measured first partial pressure to achieve a second working point on a second characteristic curve of sputtering power as a function of reactive gas partial pressure;

wherein the first partial pressure at the first or second working points is in an area of transition between a metallic mode and a compound mode.

15. The apparatus of claim 1, wherein the predetermined stoichiometric deficit of the sub-stoichiometric coating on the substrate is between 20 and 90 atomic percent of the reactive component.

16. The apparatus of claim 1, wherein the probe is a lambda probe.

* * * * *